(12) United States Patent
Iikawa

(10) Patent No.: US 7,625,141 B2
(45) Date of Patent: Dec. 1, 2009

(54) LENS BARREL INCLUDING A FLEXIBLE PRINTED WIRING BOARD

(75) Inventor: Makato Iikawa, Saitama (JP)

(73) Assignee: Hoya Corporation, Tokyo (JP)

( * ) Notice: Subject to any disclaimer, the term of this patent is extended or adjusted under 35 U.S.C. 154(b) by 285 days.

(21) Appl. No.: 11/839,755

(22) Filed: Aug. 16, 2007

(65) Prior Publication Data
US 2008/0044175 A1     Feb. 21, 2008

(30) Foreign Application Priority Data
Aug. 18, 2006    (JP) .............................. 2006-222972

(51) Int. Cl.
  *G03B 9/02*      (2006.01)
  *G03B 17/00*     (2006.01)
(52) U.S. Cl. ...................... 396/505; 396/542
(58) Field of Classification Search ................. 396/505, 396/542
See application file for complete search history.

(56) References Cited

U.S. PATENT DOCUMENTS

| | | | |
|---|---|---|---|
| 5,809,361 A | 9/1998 | Nomura et al. | |
| 5,969,889 A | 10/1999 | Iikawa et al. | |
| 6,687,459 B2 | 2/2004 | Nomura et al. | |
| 6,747,807 B2 | 6/2004 | Iikawa et al. | |
| 6,829,103 B2 | 12/2004 | Kobayashi et al. | |
| 2007/0092247 A1* | 4/2007 | Kureishi et al. | ............. 396/505 |

FOREIGN PATENT DOCUMENTS

JP          7-168077          7/1995

OTHER PUBLICATIONS

English language Abstract of JP 7-168077, (Jul. 4, 1995).

* cited by examiner

*Primary Examiner*—Rodney E Fuller
(74) *Attorney, Agent, or Firm*—Greenblum & Bernstein P.L.C.

(57) ABSTRACT

A lens barrel includes an electronic component provided in the lens barrel so that a position of the electronic component in the lens barrel is adjustable; a flexible printed wiring board connected to the electronic component and installed to extend along a surface of an internal component of the lens barrel in a direction to adjust the position of the electronic component; and a low-repulsion layer interposed between the surface of the internal component and a surface of the flexible printed wiring board which faces the surface of the internal component.

14 Claims, 5 Drawing Sheets

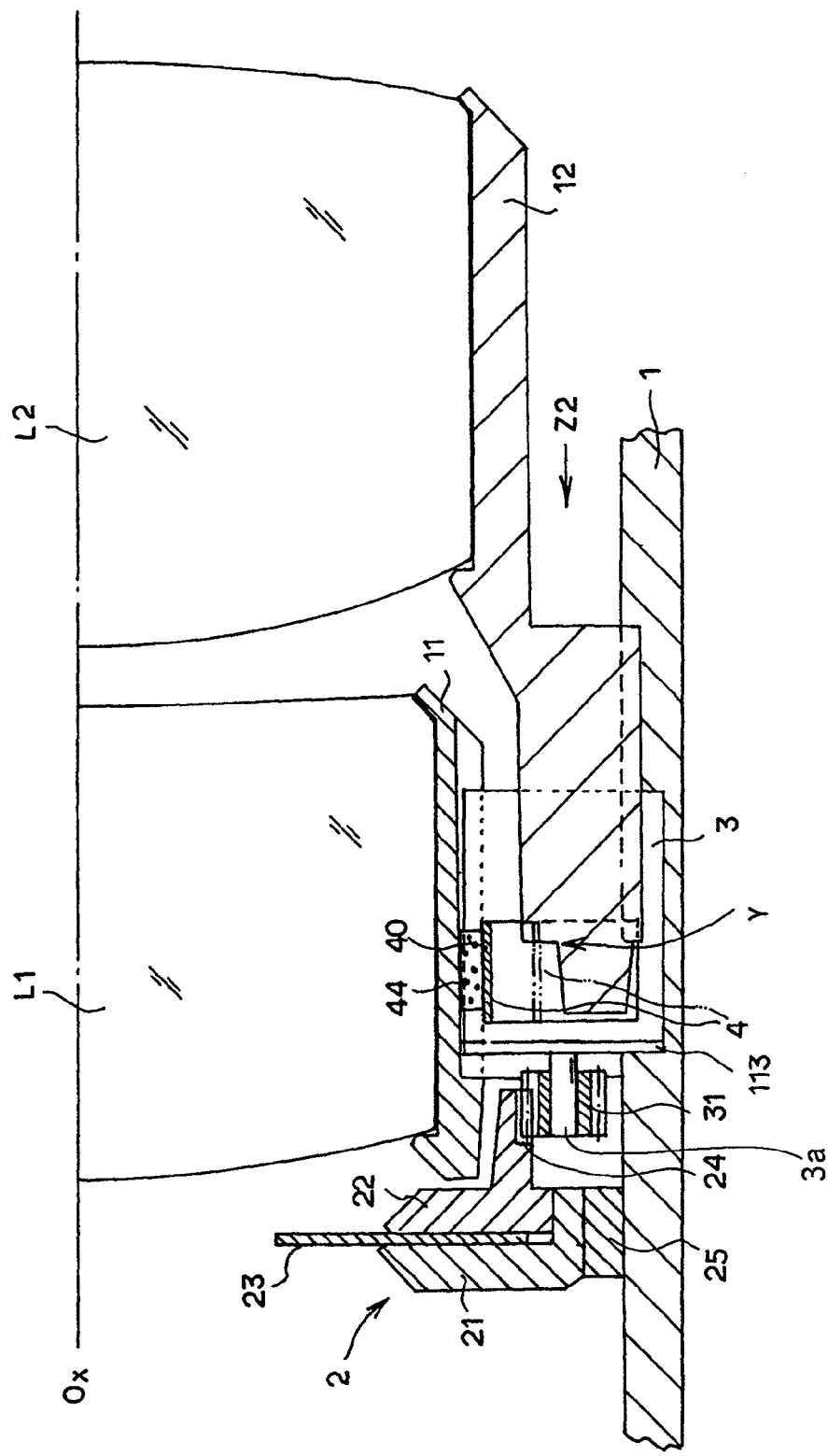

LENS BARREL INCLUDING A FLEXIBLE PRINTED WIRING BOARD

BACKGROUND OF THE INVENTION

1. Field of the Invention

The present invention relates to a lens barrel of a camera, and in particular relates to a lens barrel of a camera which includes a flexible printed wiring board used for establishing electrical connections between one or more electronic components installed in the lens barrel and another component or components installed in the lens barrel or the camera body to which the lens barrel is mounted.

2. Description of the Related Art

To install electronic components such as an electromagnetic diaphragm and various sensors in a lens barrel of an SLR camera, such as a standard lens or an interchangeable lens, a flexible PWB (printed wiring board) is often used to establish electrical connections between such electronic components and, e.g., a stationary board such as a stationary circuit board provided in the camera body. In this type of lens barrel, it is occasionally the case that the positions of such electronic components in the lens barrel are required to be adjusted in the lens barrel, so that the flexible PWB is arranged to be flexibly extendable in a bent state inside the lens barrel to allow the electronic components to move inside of the lens barrel. Namely, the flexible PWB is elastically deformed to be straightened when the electronic components are fully moved to the maximum in one direction and bent when the electronic components are fully moved to the maximum in the opposite direction, which makes it possible to adjust the positions of the electronic components while ensuring electrical connections between the electronic components and the flexible PWB regardless of the movements of the electronic components. However, if the flexible PWB is bent in such a manner, a bent portion of the flexible PWB may be deformed in a radial direction of the lens barrel so as to interfere with adjacent internal components of the lens barrel, including optical elements, thus impeding normal operations of these internal components of the lens barrel. In addition, such interference of the bent portion of the flexible PWB with adjacent internal components of the lens barrel causes faulty electrical signals to be produced due to mechanical and electrical factors.

To overcome such problems, Japanese unexamined patent publication H07-168077 discloses a lens barrel structure in which a flexible PWB is connected to a vibration sensor installed in the lens barrel, wherein the flexible PWB is installed in a cutout portion on an internal wall of the lens barrel to have an arch shape which does not interfere with the vibration sensor. This configuration makes it possible to adjust the position of the vibration sensor while preventing the flexible PWB from interfering with the vibration sensor, which resolves the aforementioned production of faulty electrical signals due to mechanical and electrical factors, e.g., due to vibrations of the flexible PWB.

In the technique of installing a flexible PWB in a lens barrel with the flexible PWB being bent in a manner as shown in the aforementioned Japanese unexamined patent publication, the amount of bending of the flexible PWB increases by bending stress applied to the flexible PWB. However, the portion of the flexible PWB whose amount of bending increases depends on the shape, dimensions or the initial bending state of the flexible PWB, and is therefore difficult to determine uniquely, and accordingly, it is impossible to predict the portion of the flexible PWB that will interfere with internal components of the lens barrel. Therefore, in the prior art, a margin of clearance between the flexible PWB and the internal components of the lens barrel needs to be provided so that no interference occurs therebetween even if the amount of bending of the flexible PWB increases at any point thereon, and it is conventionally difficult to miniaturize the lens barrel by this margin.

SUMMARY OF THE INVENTION

The present invention provides a lens barrel including a flexible PWB which is configured to make it possible to adjust the position of one or more electronic components in the lens barrel while preventing the flexible PWB from being bent to such an extent so as to interfere with internal components of the lens barrel, to thereby achieve miniaturization of the lens barrel.

According to an aspect of the present invention, a lens barrel is provided, including an electronic component provided in the lens barrel so that a position of the electronic component in the lens barrel is adjustable; a flexible printed wiring board connected to the electronic component and installed to extend along a surface of an internal component of the lens barrel in a direction to adjust the position of the electronic component; and a low-repulsion layer interposed between the surface of the internal component and a surface of the flexible printed wiring board which faces the surface of the internal component.

It is desirable for one and the other sides of the low-repulsion layer to be in intimate contact with the surface of the internal component and the surface of the flexible printed wiring board, respectively.

It is desirable for the low-repulsion layer to be integral with the surface of the flexible printed wiring board.

It is desirable for the low-repulsion layer to be integral with the surface of the internal component.

It is desirable for the position of the electronic component to be adjustable in a circumferential direction about an optical axis of the lens barrel. The internal component includes a cylindrical member, the surface of the internal component being a peripheral surface of the cylindrical member about the optical axis. The flexible printed wiring board is installed to extend in the circumferential direction along the peripheral surface of the cylindrical member.

It is desirable for the cylindrical member to include a lens frame which supports a lens group.

It is desirable for the electronic component to include a motor for changing f-number of a diaphragm unit provided in the lens barrel, and for the position of the motor to be adjustable in the circumferential direction.

It is desirable for the cylindrical member to include a first lens frame which supports a lens group, wherein the electronic component includes a motor for changing f-number of a diaphragm unit provided in the lens barrel, wherein the position of the motor is adjustable in the circumferential direction, and the lens barrel further includes a second lens frame, which is greater in diameter than the first lens frame, arranged coaxially with the first lens frame and movable in the optical axis direction to move into and out of a space around the flexible printed wiring board.

It is desirable for the flexible printed wiring board is connected at one end and the other end thereof to the electronic component and a portion of the lens barrel, respectively.

It is desirable for the low-repulsion layer to be made of a resilient soft foam.

It is desirable for the electronic component to include a motor with a rotary output shaft which extends in a direction parallel to an optical axis of the lens barrel.

It is desirable for the flexible printed wiring board to be elongated in the adjusting direction and formed in a C-shaped strip about an optical axis of the lens barrel.

It is desirable for the motor to be mounted to a motor mounting member which is secured to the cylindrical member by set screws, and for a position of the motor mounting member relative to the cylindrical member can be adjusted with the set screws being loosened.

In an embodiment, a lens barrel is provided, including a cylindrical member positioned around an optical axis of the lens barrel; an electronic component provided in the lens barrel; a mounting member to which the electronic component is mounted in a manner such that a position of the mounting member relative to the cylindrical member in a circumferential direction about the optical axis is adjustable; a flexible printed wiring board connected to the electronic component and installed to extend along an outer peripheral surface of the cylindrical member in the circumferential direction; and a low-repulsion layer formed integral with an inner surface of the flexible printed wiring board, which faces the outer peripheral surface of the cylindrical member.

According to the present invention, a stress that the flexible printed wiring board produces therein when the position of the electronic component is adjusted in the lens barrel is absorbed by the low-repulsion layer, which is provided integral with the flexible printed wiring board, to be changed into a uniform internal stress which spreads across the low-repulsion layer. Accordingly, the flexible printed wiring board produces a stress uniformly over the full range thereof in the elongated direction of the flexible printed wiring board, so that the flexible printed wiring board is uniformly deformed over the length thereof. Therefore, the flexible printed wiring board is not partly bent excessively nor interferes with other components of the lens barrel, which makes it possible to miniaturize the lens barrel by the aforementioned margin of clearance (between the flexible PWB and the internal components of the lens barrel).

The present disclosure relates to subject matter contained in Japanese Patent Application No. 2006-222972 (filed on Aug. 18, 2006), which is expressly incorporated herein by reference in its entirety.

BRIEF DESCRIPTION OF THE DRAWINGS

The present invention will be described below in detail with reference to the accompanying drawings in which:

FIG. 5 is a view similar to that of FIG. 2, showing the flexible PWB in a bent state; and FIGS. 6A and 6B are cross sectional views of a portion of the flexible PWB in different states, wherein FIG. 6A shows a state of the flexible PWB in which the radial thickness of a low-repulsion layer thereof is reduced, and FIG. 6B shows another state of the flexible PWB in which the radial thickness of the low-repulsion layer thereof increases.

DESCRIPTION OF THE PREFERRED EMBODIMENT

Figure 1:
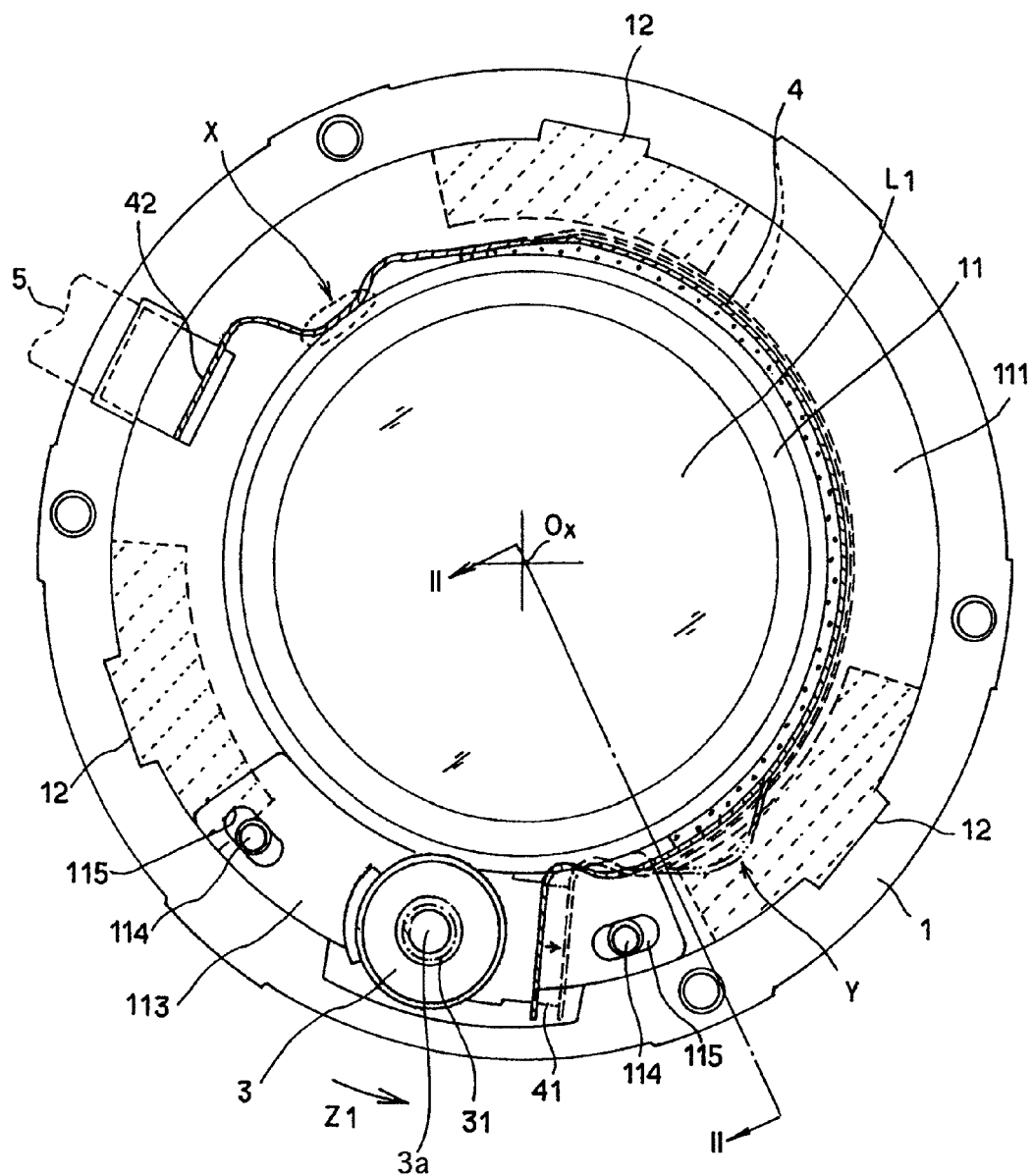
FIG. 1 is a cross sectional view of an embodiment of a lens barrel, taken along a plane orthogonal to the optical axis of the lens barrel.
Figure 2:
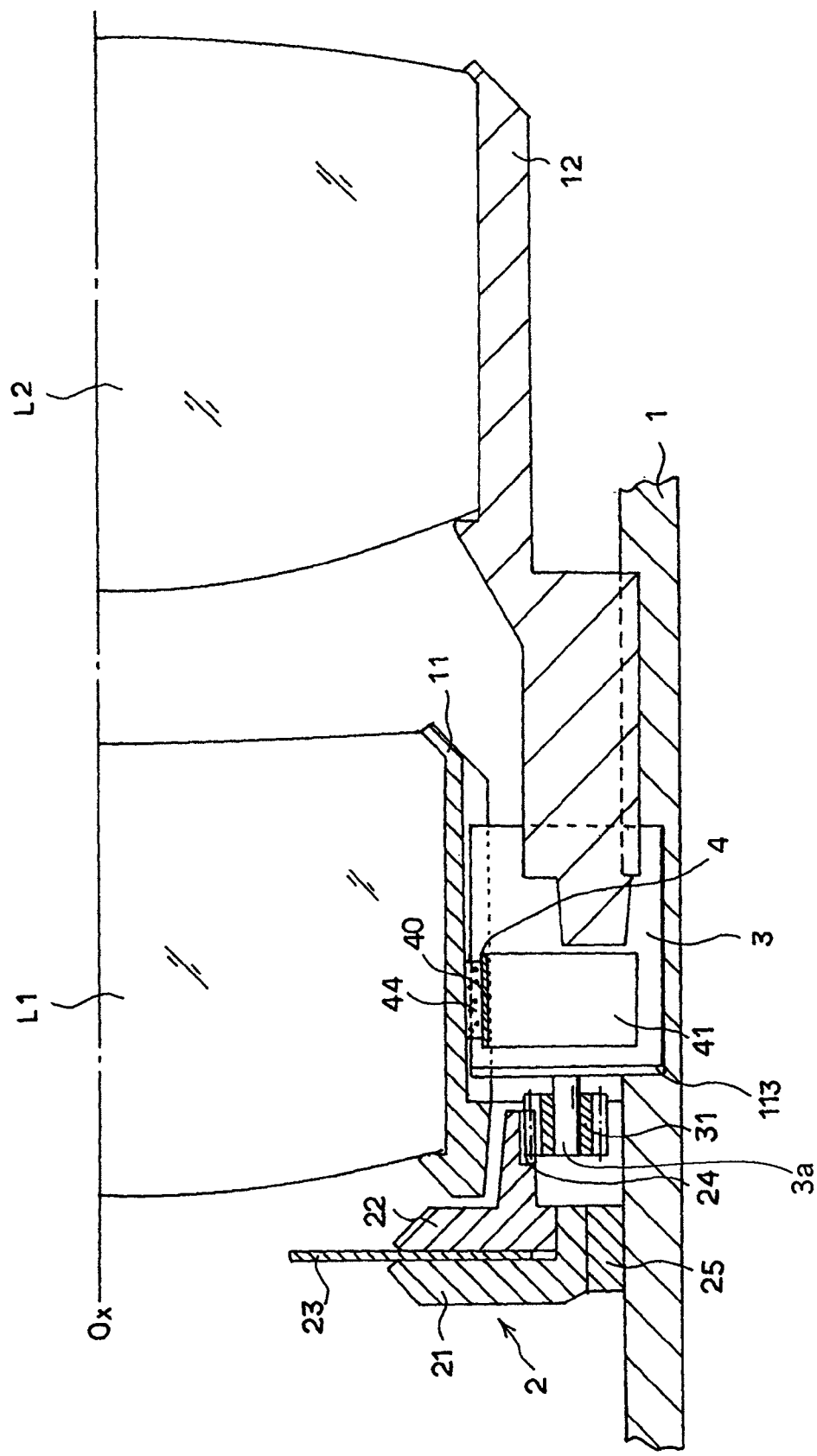
FIG. 2 is a cross sectional view taken along II-II line shown in FIG. 1.
Figure 3:
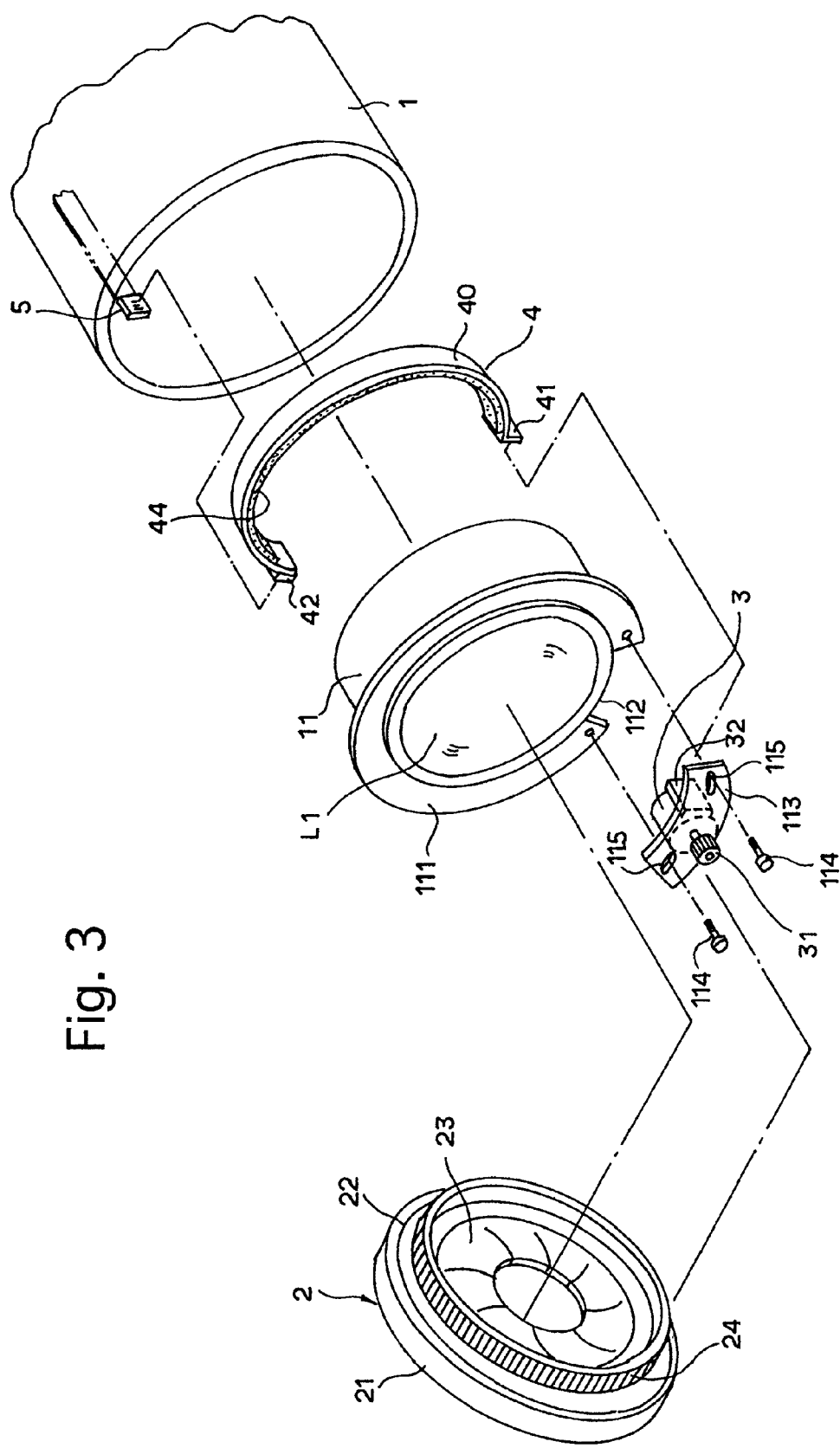
FIG. 3 is an exploded perspective view of a portion of the lens barrel shown in FIG. 1, schematically showing the structure thereof.

FIG. 1 is a cross sectional view of an essential part of an embodiment of a lens barrel, taken along a plane orthogonal to an optical axis Ox of the lens barrel, FIG. 2 is a cross sectional view taken along II-II line shown in FIG. 1, and FIG. 3 is an exploded perspective view of a portion of the lens barrel, schematically showing the structure thereof. The illustrated embodiment of the lens barrel is an interchangeable lens that is detachably attached to a camera body (not shown), and is provided in the lens barrel with an electromagnetic diaphragm which is driven by a motor provided as an electronic component installed in the lens barrel. As shown in FIGS. 2 and 3, the lens barrel is provided therein with a stationary barrel 1, and is further provided therein with a first lens group L1 which is supported by the stationary barrel 1 via a first lens frame (internal component) 11 positioned inside the stationary barrel 1. The first lens frame 11 is provided, at a position in the vicinity of the front end thereof in the optical axis direction, with a flange portion 111. The first lens frame 11 is fixed to the stationary barrel 1 at the flange portion 111. A second lens group L2 of the lens barrel, that is aligned with the first lens group L1 in the optical axis direction, is supported by a second lens frame 12 movable in the optical axis direction relative to the stationary barrel 1. For instance, the second lens group L2 is configured to serve as a focusing lens group; namely, an object to be photographed is brought into focus by adjusting the position of the second lens group L2 (second lens frame 12) in the optical axis direction. Note that each of the first and second lens groups L1 and L2 can be a lens group consisting of more than one lens element. Additionally, although one or more lens elements or groups may exist in the lens barrel in addition to the first and second lens groups L1 and L2, such lens elements or groups are not shown in the drawings.

The present embodiment of the lens barrel is provided therein, in front of the first lens frame 11, with a diaphragm unit 2. As shown in FIGS. 2 and 3, the diaphragm unit 2 is provided with a front ring 21 and a rear ring 22 which rotates about the optical axis Ox relative to the front ring 21. Rotating the rear ring 22 relative to the front ring 21 causes each of a plurality of diaphragm sector blades 23 installed between the front ring 21 and the rear ring 22 to move radially so that the aperture size, i.e., an f-number of the aperture opening formed by the plurality of diaphragm sector blades 23, varies in accordance with the amount of rotation of the rear ring 22 relative to the front ring 21. The front ring 21 of the diaphragm unit 2 is fixed to the stationary barrel 1 to be supported thereby via a mounting ring 25 with an outer peripheral surface of the front ring 21 being fixed to the mounting ring 25. The rear ring 22 is provided, on an outer peripheral surface thereof along a circumference of the rear ring 22, with a ring gear 24. Note that the ring gear 24 does not have to be formed around the entire rear ring 22. Namely, the ring gear 24 can be formed as a sector gear that is formed only over the outer peripheral surface of the rear ring 22 which is engageable with a pinion gear 31.

The flange portion 111 of the first lens frame 11 is provided with a cutout portion 112 (see FIG. 3) formed by cutting out a part of the flange portion 111 in a circumferential direction thereof. An arc-shaped motor mounting plate 113 is secured to the flange portion 111 by two set screws 114 so as to cover the cutout portion 112 from the front thereof. A small stepping motor (electronic component) 3 is fixed to the motor mounting plate 113 so that a rotary output shaft 3a (see FIGS. 1, 2 and 5) of the stepping motor 3 extends in the optical axis direction. A pair of elongated holes 115 are formed in the motor mounting plate 113 to be elongated along a circumferential direction of the first lens frame 11. Each elongated hole 115 has a predetermined length in this circumferential direction. The motor mounting plate 113 is secured to the flange portion 111 by the aforementioned two set screws 114 through the pair of elongated holes 115, respectively. Therefore, with the two set screws 114 being loosened, the motor mounting plate 113 can be moved relative to the first lens frame 11 in a circumferential direction thereof within the range of movement of the two set screws 114 in the pair of elongated holes 115 therealong, respectively, to adjust the position (mounting point) of the motor mounting plate 113 relative to the first lens frame 11 in the circumferential direction thereof within this range of movement. Additionally, the pinion gear 31 is fixedly fitted on the rotary output shaft of the stepping motor 3 and engaged with the ring gear 24 that is formed on the rear ring 22 of the diaphragm unit 2. Therefore, rotating the pinion gear 31 by rotation of the stepping motor 3 causes the ring gear 24, with which the pinion gear 31 is engaged, i.e., the rear ring 22 to rotate about the optical axis Ox, thus causing the angle of rotation of each diaphragm sector blade 23 to change to thereby change f-number of the lens barrel in accordance with variations in amount of rotation of the rear ring 22 relative to the front ring 21.

The lens barrel is provided between the stationary barrel 1 and the first lens frame 11 with a flexible PWB (printed wiring board) 4 that extends along an outer peripheral surface of the first lens frame 11 in a circumferential direction thereof. The flexible PWB 4 is formed in a C-shaped strip, and provided at one end thereof with a connector 41 which is connected to an electrode portion 32 of the stepping motor 3 to be electrically connected to traces 43 (see FIG. 4) of a pattern printed on the flexible PWB 4. The flexible PWB 4 is elongated toward the other end thereof circumferentially along an outer peripheral surface of the first lens frame 11 over an approximately three quarters of the circumference of the first lens frame 11, and a connector 42 provided at the other end of the flexible PWB 4 is connected to another PWB (printed wiring board) to establish electrical connections therewith. The PWB 5 is elongated in a direction parallel to the optical axis Ox along one side of the stationary barrel 1 up to, e.g., a bayonet portion (not shown) provided at the rear end of the lens barrel to be electrically connected to electric terminals provided on the bayonet portion. These electric terminals are respectively brought into contact with corresponding electric terminals provided on a lens mount of a camera body to establish electrical connections therewith upon the lens barrel being mounted to the lens mount of the camera body.

Figure 4:
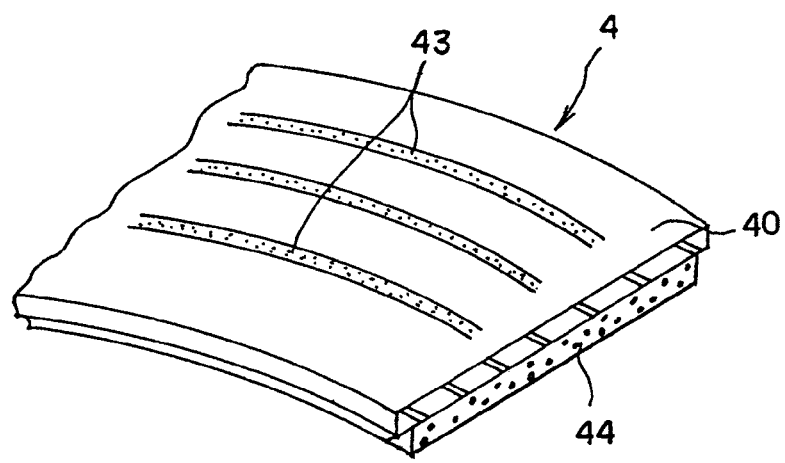
FIG. 4 is a perspective view, partly in cross section, of a portion of a flexible PWB shown in FIGS. 1 through 3.
Figure 6A:
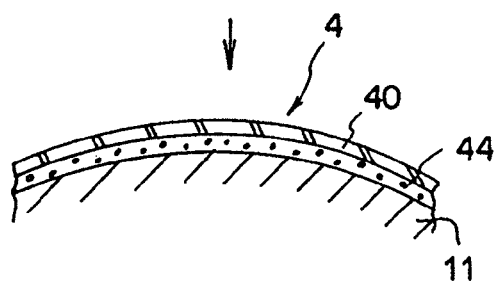

As shown in FIG. 4 that shows a perspective view of a portion of the flexible PWB 4, the flexible PWB 4 is composed almost exclusively of a conventional flexible PWB; namely, the traces 43, each of which is made of a thin layer of conductive material, is printed on a surface of a resin-made flexible insulating base 40. In addition, a low-repulsion layer 44 made of a low-repulsion material such as a low-repulsion soft foam is formed integral with an inner surface of the flexible insulating base 40, specifically, an inner peripheral surface of the flexible insulating base 40 which is curved around the optical axis Ox to face an outer peripheral surface of the first lens frame 11. The low-repulsion material that forms the low-repulsion layer 44 is a material with a small coefficient of rebound, compared with the resin-made flexible insulating base 40, and is made of, e.g., a resin foam that is used to absorb shock and impact. Various materials have been proposed for this type of low-repulsion material, hence, the detailed description about this material is omitted. In the present embodiment of the lens barrel, this type of low-repulsion material is formed in a thin and narrow strip shape, and this thin and narrow strip of low-repulsion material is bonded to an inner peripheral surface of the flexible insulating base 40 by an adhesive to be integral therewith to form the low-repulsion layer 44. The dimensions (thickness, width and length) of the low-repulsion layer 44 are appropriately determined based on the width, length and flexibility of the flexible PWB 4. As shown in FIG. 1, the flexible PWB 4 is curved in an arc shape while being extended from the stepping motor 3 toward the PWB 5 in a counterclockwise direction (direction as shown by the arrow Z1 shown in FIG. 1) as viewed from the front of the lens barrel to extend along an outer peripheral surface of the first lens frame 11. The length of the flexible PWB 4 is determined so that the inner surface of the flexible PWB 4 (i.e., the low-repulsion layer 44 on the inner peripheral surface of the flexible PWB 4) is in contact with almost the entire outer peripheral surface of the first lens frame 11 while the low-repulsion layer 44 is resiliently deformed (compressed) radially inwards to reduce the radial thickness thereof as shown in FIG. 6A when the motor mounting plate 113 is moved to the limit of movement thereof in the clockwise direction (direction opposite to the direction shown by the arrow Z1) as viewed in FIG. 1 relative to the flange portion 111. The flexible PWB 4 is bonded to the aforementioned outer peripheral surface of the first lens frame 11 in an area X (shown in FIG. 1) at a portion of the flexible PWB 4 in the vicinity of the other end thereof by a fixing device such as an adhesive or a double-faced tape.

When the lens barrel that has the above described structure is attached to the lens mount of camera body, a control signal (diaphragm control signal) from the camera body is input to the PWB 5 via the aforementioned electric terminals on the bayonet portion of the lens barrel, subsequently transmitted to the flexible PWB 4 that is connected to the electric terminals via the connector 42 of the flexible PWB 4, and subsequently input to the stepping motor 3 via the connector 41 of the flexible PWB 4 and the electrode portion 32 of the stepping motor 3. The stepping motor 3 rotates by a required amount of rotation in accordance with the input control signal. This rotation of the stepping motor 3 is transferred from the pinion gear 31 to the ring gear 24 of the diaphragm unit 2 to rotate the rear ring 22 of the diaphragm unit 2 by a required angle of rotation. Due to this rotation of the rear ring 22 of the diaphragm unit 2, the setting of the aperture opening of the diaphragm unit 2 (i.e., f-number) is determined to correspond to the amount of rotation of the rear ring 22.

A diaphragm adjusting operation for making a reference control signal from the camera body and a reference f-number that is controlled in the diaphragm unit 2 correspond to each other is carried out as a camera diaphragm adjustment. This diaphragm adjusting operation is performed by adjusting the position (mounting point) of the stepping motor 3 in a circumferential direction about the optical axis Ox relative to the first lens frame 11. Specifically, in this diaphragm adjusting operation, firstly the two set screws 114, which are used to fix the motor mounting plate 113 to the first lens frame 11, are loosened. Subsequently, adjusting the position of the motor mounting plate 113 in the circumferential direction about the optical axis Ox by moving the motor mounting plate 113 along the pair of elongated holes 115 (i.e., adjusting the position of the motor mounting plate 113 in the circumferential direction about the optical axis Ox by moving the motor mounting plate 113 relative to the first lens frame 11) causes the rear ring 22, which is integral with the ring gear 24, to rotate according to variations in position of the stepping motor 3 in the circumferential direction about the optical axis Ox since the pinion gear 31 and the ring gear 24 remain engaged with each other, thus causing the reference f-number to change. Therefore, the position of the stepping motor 3 in the circumferential direction about the optical axis Ox is adjusted so that the f-number set by the diaphragm unit 2 becomes a reference f-number upon the diaphragm unit 2 receiving a reference control signal from the camera body. After the completion of this diaphragm adjusting operation, the two set screws 114 are fastened again to fix the motor mounting plate 113 to the first lens frame 11. From then on, the above described operations are performed; namely, the stepping motor 3 rotates in accordance with the diaphragm control signal from the camera body to rotate the ring gear 24 via the pinion gear 31 to thereby control the diaphragm unit 2 so that f-number set by the diaphragm unit 2 corresponds to the diaphragm control signal.

Figure 6B:
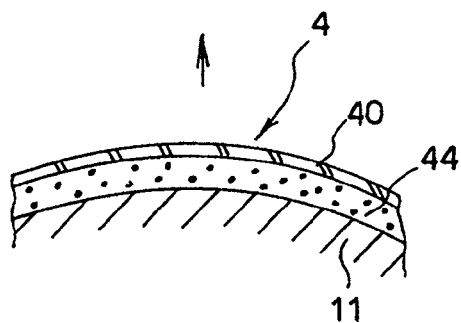

When the position of the stepping motor 3 in the circumferential direction about the optical axis Ox is adjusted in this manner in the diaphragm adjusting operation, if the stepping motor 3 is moved in the counterclockwise direction as viewed in FIG. 1 (direction shown by the arrow Z1) in the circumferential direction about the optical axis Ox, the connector 41 at one end of the flexible PWB 4 is also moved in the same counterclockwise direction, so that the distance between the connector 41 and the connector 42 that is positioned at the other end of the flexible PWB 4 in the circumferential direction about the optical axis Ox becomes short, which causes the flexible PWB 4 to produce a stress which makes the flexible PWB 4 expand radially outwards as a whole. In this state, the low-repulsion layer 44, which is provided on an inner surface of the flexible PWB 4, absorbs this stress and changes this stress into a uniform internal stress which evenly distributes across the low-repulsion layer 44. Therefore, as shown in FIG. 6B that shows a portion of the flexible PWB 4, the low-repulsion layer 44 is deformed so that the radial thickness thereof increases uniformly in the circumferential direction about the optical axis Ox; moreover, as shown by dotted lines in FIG. 1, the flexible PWB 4 has expanded radially outwards with the distance between the outer peripheral surface of the first lens frame 11 to which the flexible PWB 4 is bonded and the outer peripheral surface of the flexible PWB 4 remaining constant in a circumferential range between one end of the flexible PWB 4 on the connector 41 side and the area X on the other end of the flexible PWB 4, in which the flexible PWB 4 is bonded to the outer peripheral surface of the first lens frame 11. In the case where the flexible PWB 4 does not have the low-repulsion layer 44, only a part Y of the flexible PWB 4 in the circumferential direction about the optical axis Ox excessively expands radially outwards as shown by two-dot chain lines in FIG. 1.

Since the flexible PWB 4 is deformed uniformly over the length of the flexible PWB 4 in this manner, the second lens frame 12 is prevented from interfering with the flexible PWB 4 even if the second lens group L2 moves forward in the optical axis direction (direction shown by the arrow Z2 in FIG. 5) up to a point where the second lens frame 12 partly enters an area radially outside of the outer peripheral surface of the first lens frame 11 to which the flexible PWB 4 is bonded when a focusing operation of the lens barrel is carried out as shown in FIG. 5. If the part Y of the flexible PWB 4 excessively expands radially outwards as described above, the part Y interferes with the second lens frame 12 as shown in FIG. 5. To prevent this from occurring, the lens barrel needs to be designed so that the inner diameter of the second lens frame 12 is greater. However, in the present embodiment of the lens barrel, the second lens frame 12 does not have to be designed to have a large inner diameter to secure a margin of clearance between the flexible PWB 4 and the first lens frame 11 and adjacent internal components, which makes it possible to achieve miniaturization of the lens barrel.

Additionally, since the low-repulsion layer 44 is provided on the curved inner peripheral surface of the flexible PWB 4, moving the stepping motor 3 (the motor mounting plate 113) fully in the clockwise direction as viewed in FIG. 1 (direction opposite to the direction shown by the arrow Z1) causes the inner peripheral surface of the flexible PWB 4 to be pressed against an outer peripheral surface of the first lens frame 11 to thereby compress the low-repulsion layer 44 radially inwards so as to reduce the radial thickness thereof. However, at this time also, the low-repulsion layer 44 absorbs a stress applied thereto and is compressed uniformly, and accordingly, no mechanical damage is given to the flexible PWB 4 or the first lens frame 11. Therefore, the flexible PWB 4 can be designed to have a required minimum circumferential length, and this makes it possible to achieve a further reduction in radial thickness of the flexile PWB 4 when it is bent radially outwards to thereby make it possible to achieve miniaturization of the lens barrel.

Although the low-repulsion layer 44 is made from a thin layer of low-repulsion material which is bonded to the inner peripheral surface of the flexible PWB 4 in the above illustrated embodiment of the lens barrel, it is possible that such a thin layer of low-repulsion material be fixed to the inner peripheral surface of the flexible PWB 4 to be integral therewith by plastic-welding. As another embodiment of the low-repulsion layer, it is possible to form the low-repulsion layer by coating the inner peripheral surface of the flexible PWB 4 with a low-repulsion material. As another embodiment of the low-repulsion layer, it is possible to form the low-repulsion layer on an outer peripheral surface of a hollow cylinder (by adhesive, plastic-welding or coating) from which the flexible PWB 4 extends and to make a surface of the low-repulsion layer contact the inner peripheral surface of the flexible PWB.

Although the present invention has been applied to a stepping motor as an example of an electronic component in the above illustrated embodiment of the lens barrel, the present invention can be applied to any type of lens barrel in a similar manner if the lens barrel is provided with various electronic components, e.g., a vibration sensor such as disclosed in the aforementioned Japanese unexamined patent publication or other sensors as long as such sensors are those which are required that the positions thereof be adjusted after installation into the lens barrel. Additionally, the present invention is not limited to a particular flexible PWB such as described above that is installed on a round peripheral surface of a cylindrical member, and can be applied to another type of flexible PWB which is installed to extend substantially straight in an optical axis direction. For instance, the present invention can also be applied to a flexible PWB which partly extends in an optical axis direction from a portion thereof on a round peripheral surface of a cylindrical member. In addition, an internal component of the lens barrel to which a flexible PWB is installed along a surface of the internal component is not limited solely to a cylindrical member such as disclosed in the above described embodiment of the lens barrel; the present invention is applicable similarly if the cylindrical member is of a type allowing the flexible PWB to extend along an outer peripheral surface of the cylindrical member.

Obvious changes may be made in the specific embodiment of the present invention described herein, such modifications being within the spirit and scope of the invention claimed. It is indicated that all matter contained herein is illustrative and does not limit the scope of the present invention.

What is claimed is:

1. A lens barrel comprising:
   an electronic component provided in said lens barrel so that a position of said electronic component in said lens barrel is adjustable;
   a flexible printed wiring board connected to said electronic component and installed to extend along a surface of an internal component of said lens barrel in a direction to adjust said position of said electronic component; and
   a low-repulsion layer interposed between said surface of said internal component and a surface of said flexible printed wiring board which faces said surface of said internal component.

2. The lens barrel according to claim 1, wherein one and the other sides of said low-repulsion layer are in intimate contact with said surface of said internal component and said surface of said flexible printed wiring board, respectively.

3. The lens barrel according to claim 2, wherein said low-repulsion layer is integral with said surface of said flexible printed wiring board.

4. The lens barrel according to claim 2, wherein said low-repulsion layer is integral with said surface of said internal component.

5. The lens barrel according to claim 1, wherein said position of said electronic component is adjustable in a circumferential direction about an optical axis of said lens barrel,
   wherein said internal component comprises a cylindrical member, said surface of said internal component being a peripheral surface of said cylindrical member about said optical axis, and
   wherein said flexible printed wiring board is installed to extend in said circumferential direction along said peripheral surface of said cylindrical member.

6. The lens barrel according to claim 5, wherein said cylindrical member comprises a lens frame which supports a lens group.

7. The lens barrel according to claim 5, wherein said electronic component comprises a motor for changing f-number of a diaphragm unit provided in said lens barrel, and
   wherein said position of said motor is adjustable in said circumferential direction.

8. The lens barrel according to claim 7, wherein said motor is mounted to a motor mounting member which is secured to said cylindrical member by set screws, and
   wherein a position of said motor mounting member relative to said cylindrical member can be adjusted with said set screws being loosened.

9. The lens barrel according to claim 5, wherein said cylindrical member comprises a first lens frame which supports a lens group,
   wherein said electronic component comprises a motor for changing f-number of a diaphragm unit provided in said lens barrel,
   wherein said position of said motor is adjustable in said circumferential direction, and
   wherein said lens barrel further comprises a second lens frame, which is greater in diameter than said first lens frame, arranged coaxially with said first lens frame and movable in said optical axis direction to move into and out of a space around said flexible printed wiring board.

10. The lens barrel according to claim 1, wherein said flexible printed wiring board is connected at one end and the other end thereof to said electronic component and a portion of said lens barrel, respectively.

11. The lens barrel according to claim 1, wherein said low-repulsion layer is made of a resilient soft foam.

12. The lens barrel according to claim 1, wherein said electronic component comprises a motor with a rotary output shaft which extends in a direction parallel to an optical axis of said lens barrel.

13. The lens barrel according to claim 1, wherein said flexible printed wiring board is elongated in said adjusting direction and formed in a C-shaped strip about an optical axis of said lens barrel.

14. A lens barrel comprising:
    a cylindrical member positioned around an optical axis of said lens barrel;
    an electronic component provided in said lens barrel;
    a mounting member to which said electronic component is mounted in a manner such that a position of said mounting member relative to said cylindrical member in a circumferential direction about said optical axis is adjustable;
    a flexible printed wiring board connected to said electronic component and installed to extend along an outer peripheral surface of said cylindrical member in said circumferential direction; and
    a low-repulsion layer formed integral with an inner surface of said flexible printed wiring board, which faces said outer peripheral surface of said cylindrical member.

* * * * *

UNITED STATES PATENT AND TRADEMARK OFFICE
CERTIFICATE OF CORRECTION

| | | |
|---|---|---|
| PATENT NO. | : 7,625,141 B2 | Page 1 of 1 |
| APPLICATION NO. | : 11/839755 | |
| DATED | : December 1, 2009 | |
| INVENTOR(S) | : Iikawa | |

It is certified that error appears in the above-identified patent and that said Letters Patent is hereby corrected as shown below:

On the title page, at item (75), Inventors, line 7 of the printed patent, change "Makato" to --Makoto--.

Signed and Sealed this

Sixteenth Day of March, 2010

David J. Kappos
*Director of the United States Patent and Trademark Office*